United States Patent [19]

Selders

[11] 4,101,341

[45] Jul. 18, 1978

[54] CDSE-SNSE PHOTOVOLTAIC CELL

[75] Inventor: Matthias Peter Selders, Kronberg, Fed. Rep. of Germany

[73] Assignee: Battelle Development Corporation, Columbus, Ohio

[21] Appl. No.: 793,626

[22] Filed: May 4, 1977

[51] Int. Cl.² .................. H01L 31/06; B05D 5/12
[52] U.S. Cl. .................. 136/89 TF; 136/89 CD; 136/89 ST; 357/16; 357/30; 427/76
[58] Field of Search .......... 136/89 C, 89 CD, 89 ST, 136/89 TF; 250/211 R, 211 J, 212; 357/16, 30; 427/76; 29/572

[56] References Cited

U.S. PATENT DOCUMENTS

| 3,374,108 | 3/1968 | Keramidas | 136/89 X |
| 3,641,406 | 2/1972 | Albers et al. | 357/16 |
| 3,975,211 | 8/1976 | Shirland | 136/89 |
| 3,982,260 | 9/1976 | Wald | 357/15 |

OTHER PUBLICATIONS

B. L. Sharma et al., "Semiconductor Heterojunctions", Pergamon Press (1974), pp. 133–137 and Chapter 8 in its entirety.

*Primary Examiner*—Aaron Weisstuch
*Attorney, Agent, or Firm*—Barry S. Bissell

[57] ABSTRACT

The invention relates to a photovoltaic cell for converting solar energy into electrical power and which has, in sandwich construction, two different polycrystalline, semiconductor layers in intimate contact and disposed on a metal or metal-coated substrate, the cell being provided with a light-transmissive or grating-shaped electrode on the side toward the light. The cell layers comprise the semiconducting selenides of cadmium and tin.

7 Claims, 1 Drawing Figure

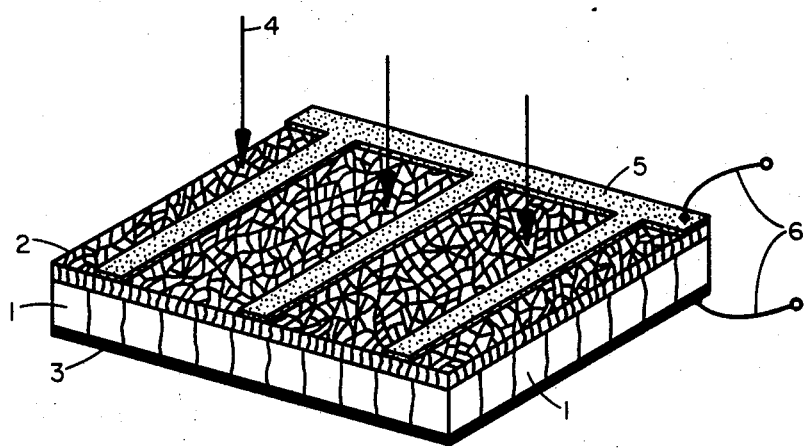

CDSE-SNSE PHOTOVOLTAIC CELL

BACKGROUND OF THE INVENTION

The photoresponsive elements of the best known commercial solar cells are monocrystalline silicon and a junction of polycrystalline cadmium sulfide and copper sulfide (Clevite cell). The solar cells comprising monocrystalline silicon wafers can convert solar energy to electrical power with a degree of efficiency of up to 15% and are presently used in satellites and for some special uses on earth. Solar cells comprising monocrystalline semiconductive layers are considered too expensive for use as current producers in competition with conventional power sources.

The solar cells of polycrystalline cadmium sulfide and copper sulfide are substantially cheaper to produce than monocrystalline silicon wafers, but unfortunately, they have a level of efficiency of only 5 to 6%. Besides this relatively low level of efficiency, their technical use on a wide scale is also hindered by high production costs and short operating life or stability with regard to their electrical properties.

Elements of the semiconducting compositions of the present invention have been suggested in various combinations in the prior art. For example, U.S. Pat. No. 3,104,188 discloses a solar cell junction between cadmium selenide and a suitable metal, with disclosed suitable metals being nickel, chromium, platinum, gold, and silver. A tin electrode may be used. U.S. Pat. No. 2,276,198 concerns a photocell which is a selenium semiconductor upon a base electrode plate and having thereon thin films of a fourth group metal, such as tin, and then a platinum or silver film. U.S. Pat. No. 3,226,271 and 3,342,546 include teachings of possible interest as to CdSe with the first disclosing tin useful to dope the CdSe and with the second including the phase diagram of cadmium and selenium. A solar photovoltaic cell including CdSe in a graded energy gap is taught in U.S. Pat. No. 3,496,024. Example 13 in U.S. Pat. No. 3,811,953 speaks of using CdS/cadmium stannate ($Cd_2SnO_4$) for generation of electrical potential by sunlight exposure.

SUMMARY OF THE INVENTION

It is an object of the present invention to provide a lower cost, photovoltaic cell which can be made with relatively large surface area and good efficiency over long periods of time.

In accordance with the objective, the invention is a photovoltaic cell which can be fabricated with low cost deposition techniques because of the good crystallographic match between semiconductive material layers. The good match also allows thin polycrystalline layers of less than about 3 microns to be used. The present invention is a photo-sensitive semiconductor junction, a conductive substrate for supporting the semiconductor layers and acting as one electrode, and a second electrode on the semiconductor junction face opposite the substrate. The second electrode is either transparent or is a grating or grid pattern layer which allows light to strike the upper semiconductive layer of the junction. The improved semiconductor junction comprises regions of n-type cadmium selenide and p-type tin selenide. The layers are preferably polycrystalline, but at least one may be a single crystal.

The substrate and the second electrode may advantageously be silver, indium, cadmium, zinc or gold. The cadmium selenide or the tin selenide may each be either on the substrate or facing the light. Preferably the first layer (on the substrate) is about 3 microns thick and the second layer is about 0.3 to 1 micron thick.

The semiconductor junction may be produced by physical vapor deposition of successive layers of the two semiconductor materials and the electrode onto a substrate. In an alternate procedure, a first layer of n-type cadmium selenide is evaporated on a substrate and then is brought in contact with a solution containing tin ions. The tin ions exchange with cadmium ions in the surface of the first layer forming a region of tin selenide on top of a region of cadmium selenide. The second electrode may then be applied. This latter method produces a dense second region and a well-matched interface at the junction.

DESCRIPTION OF THE INVENTION

Referring to the FIGURE, a photovoltaic cell according to the invention is shown and consists of polycrystalline semiconductor layers of n-type cadmium selenide 1 and p-type tin selenide 2 on a conductive substrate 3. The second electrode 5, in a grating pattern, is disposed on the tin selenide layer. Incident radiation is represented by arrows 4 striking the upper surface of the tin selenide layer and the second electrode. Leads 6 are connected to the substrate and the second electrode for tapping electricity from the cell.

To produce the photovoltaic cell according to the invention, the two selenide layers are advantageously vapor-deposited in the desired sequence on the heated substrate at a pressure of about $10^{-5}$ torr. Preferably, the first deposited layer is about 3 $\mu$m in thickness, and the second layer is about 0.3 to 1 $\mu$m in thickness. The electrode on the side which is towards the light is thereafter also vapor-deposited.

In another embodiment of the production method according to the invention, a thin cadmium selenide layer is vapor-deposited on the substrate and then partially converted into a tin selenide layer by immersion in a tin ion-containing solution. Optionally, the tin selenide may be first deposited, followed by a cadmium for tin ion-exchange at the exposed surface.

In a third production method, the cadmium selenide and the tin selenide layers of the cell according to the invention can also be produced in either order by spraying and thermally decomposing cadmium and selenium-containing or tin and selenium-containing solutions, respectively, on a substrate which is heated to about 100° to 300° C.

N-type carrier concentrations necessary for successful photoelectric behavior were obtained in CdSe by non-stoichiometry or by doping with, for example, indium or cadmium. P-type carrier concentrations were obtained in SnSe by non-stoichiometry, but could be obtained by known dopants.

The cells of the present invention may be fabricated with very thin regions or layers because of the optical absorption properties and the close match of the crystallographic properties (primarily the lattice constants) of the cadmium and tin selenides. The reduction in thickness (compared with the Clevite or monocrystalline silicon cells) and the polycrystalline nature allows the use of less expensive deposition techniques, such as, the vapor deposition, wet chemical ion-exchange and decomposition reaction previously mentioned. A high efficiency can also be obtained especially with the ion-exchange method which produces a good interface between the materials. Moreover, etching the CdSe first layer with, for example, HCl and a mixture of bromine in methanol or ethanol can improve the interface. The selenide materials also appear to be quite stable.

The cell may also be produced by starting with a single crystal layer of one of the materials and then vapor depositing the second. This produces a good solar cell or photodetector but sacrifices cost advantages of the previously described cells.

DESCRIPTION OF THE PREFERRED EMBODIMENTS

EXAMPLE 1

An n-type cadmium selenide layer about 3 μm in thickness may be vapor deposited at a pressure of about $10^{-5}$ torr on a metallized glass or plastic substrate having a silver coating which is about 1 μm in thickness. During the deposition process, the substrate temperature is set to between about 150° to 250° C, preferably about 200° C, in order to achieve the best possible crystalline structure of the layer and resulting good photoelectric properties (high mobility and operating life of the electrical charge carriers produced by sunlight). A carrier concentration of about $10^{17}$ cm$^{-3}$ is obtained by non-stoichiometry.

Subsequently, at a substrate temperature of between about 250° to 350° C, preferably about 300° C, and also under a pressure of about $10^{-5}$ torr, a p-type tin selenide layer of about 0.3 to 1.0 μm in thickness may be vapor deposited on the cadmium selenide layer. A carrier concentration of about $10^{17}$ cm$^{-3}$ is again obtained by non-stoichiometry.

A front electrode 5 (see the accompanying FIGURE) may also be vapor deposited on the tin selenide layer under a high vacuum. The electrode 5 comprises gold in the form of a grating with narrow bars, so that the light can reach the upper semiconductor layer. However, it is important, because of the small degree of contact by the electrode, that the electrical resistance in the material layer under the grating is sufficiently low so that there is not a substantial voltage drop in the cell, which would thus reduce the level of efficiency. Instead of a vapor-deposited metal grating, it is also possible to apply a ready-made net of, for example, gold-plated copper, by pressing onto the tin selenide layer.

Following the deposition processing the cell is preferably annealed for several hours at about 150°–170° C in inert gas to increase carrier mobility and lifetime.

EXAMPLE 2

A cell according to the invention was again produced by vapor deposition, but in this embodiment the p-type tin selenide layer, which was about 3 μm in thickness, was first deposited on the substrate at a substrate temperature of about 300° C. Thereafter, the n-type cadmium selenide layer about 0.5 – 1.0 μm in thickness was vapor-deposited upon the tin selenide layer, in the same manner, at a temperature of about 200° C. Finally, the gold front electrode (the electrode which is exposed to incident light), was applied in the manner described above.

EXAMPLE 3

An n-type cadmium selenide layer about 4 μm in thickness was first vapor deposited on a heated molybdenum substrate. The layer was subsequently converted in a surface layer, to tin selenide by dipping in a solution of SnCl$_2$ acidified with HCl to a pH of about 2, whereupon the ion exchange of Sn for Cd was effected at about 90° C. The cadmium chloride product is water soluble and was merely washed away. A front electrode of gold was then applied by vapor deposition on the surface of the tin selenide region.

EXAMPLE 4

The n-type cadmium selenide layer may be produced on a substrate by a chemical transport reaction of cadmium-bearing solutions (for example, the chloride, propionate, acetate, formate or nitrate of cadmium) and selenium-bearing solutions (such as selenourea; N,N-dimethyl selenourea; allyl selenocyanate, etc.). In this method the cadmium-bearing and the selenium-bearing solutions are sprayed together onto a heated substrate and then the formation of the desired polycrystalline cadmium selenide layer is effected by thermal decomposition at a temperature of about 300° C.

Subsequently, the tin selenide layer is preferably formed by dipping the cadmium selenide layer into a SnCl$_2$ bath, in a similar manner to the production method of Example 3, or thermal decomposition of tin and selenium-bearing solutions sprayed onto the cadmium selenide layer.

The succession of the semiconductor layers applied by such transport reactions can also be reversed, for adaptation to the desired structure of the cell to be produced. According to the literature SnSe can be chemically grown from metal organic solutions such as tetramethyl or tetraethyl tin.

EXAMPLE 5

A tin selenide layer is formed by vapor deposition on a metallized glass substrate to a thickness of about 3 μm. The substrate is then dipped into a solution of about 2.4 grams of CdCl$_2$ in 100 ml water. The acidity of the solution has been adjusted to pH = 2 by HCl additions and the solution is buffered with hydrazine. At about 90° C the ion exchange of Cd for Sn takes place and the semiconductor junction is formed.

A more dense CdSe region may also be formed in the above process using a concentration of 20 g CdCl$_2$/150 ml water and buffering with ammonium chloride.

We claim

1. A photovoltaic cell comprising a photosensitive semiconductor junction and electrode means for withdrawing electrical energy from the semiconductor junction, wherein the semiconductor junction comprises regions of n-type cadmium selenide and p-type tin selenide.

2. The photovoltaic cell of claim 1 wherein the regions are polycrystalline.

3. The photovoltaic cell of claim 1 wherein the regions comprise thin layers between about 0.3 and 3 microns thick.

4. The photovoltaic cell of claim 1 wherein the electrode means comprises a conductive substrate and a grid-shaped conductor separated by the semiconductor junction.

5. The photovoltaic cell of claim 1 wherein the semiconductor junction is fabricated by forming a layer of n-type cadmium selenide and thereafter effecting a tin cadmium ion-exchange at an exposed surface of the cadmium selenide layer.

6. The photovoltaic cell of claim 1 wherein the semiconductor junction is fabricated by forming a layer of p-type tin selenide and thereafter effecting a cadmium for tin ion exchange at an exposed surface of the tin selenide layer.

7. A method for production of a photovoltaic cell comprising:
   (a) applying to a conductive substrate a first layer of a semiconductor material selected from n-type cadmium selenide and p-type tin selenide.
   (b) ion exchanging the cadmium for tin or the tin for cadmium, respectively, in an exposed surface region opposite the substrate, such that layered regions of both p-type tin selenide and n-type cadmium selenide are present, and
   (c) applying an upper electrode on the exposed surface opposite the substrate.

* * * * *